United States Patent
Sonawane et al.

(10) Patent No.: US 9,829,536 B2
(45) Date of Patent: Nov. 28, 2017

(54) PERFORMING ON-CHIP PARTIAL GOOD DIE IDENTIFICATION

(71) Applicant: NVIDIA Corporation, Santa Clara, CA (US)

(72) Inventors: Milind Sonawane, Syracuse, NY (US); Jonathon E. Colburn, Scotts Valley, CA (US); Amit Sanghani, San Jose, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 2 days.

(21) Appl. No.: 15/015,100

(22) Filed: Feb. 3, 2016

(65) Prior Publication Data
US 2017/0219652 A1    Aug. 3, 2017

(51) Int. Cl.
*G01R 31/28* (2006.01)
*G01R 31/317* (2006.01)
*G01R 31/3177* (2006.01)

(52) U.S. Cl.
CPC ... *G01R 31/31703* (2013.01); *G01R 31/3177* (2013.01)

(58) Field of Classification Search
CPC .................. G01R 31/31703; G01R 31/3177
See application file for complete search history.

(56) References Cited

U.S. PATENT DOCUMENTS

| | | | |
|---|---|---|---|
| 2002/0021140 A1* | 2/2002 | Whetsel | G01R 31/31703 324/750.3 |
| 2010/0121585 A1* | 5/2010 | Wang | G01B 31/318547 702/59 |
| 2012/0159274 A1* | 6/2012 | Balakrishnan | G01R 31/3187 714/732 |
| 2012/0166890 A1* | 6/2012 | Janarthanam | G06F 11/08 714/49 |
| 2016/0349314 A1* | 12/2016 | Dubrova | G01R 31/31813 |

* cited by examiner

*Primary Examiner* — Thien D Nguyen
(74) *Attorney, Agent, or Firm* — Artegis Law Group, LLP

(57) ABSTRACT

In one embodiment, a multiple input signature register (MISR) shadow works with a MISR to compress test responses of a layout partition in a functional region of an integrated circuit. In operation, for each test pattern in a test pattern split, the MISR generates a MISR signature based on the responses of the layout partition. As the test patterns in the test pattern split execute, the MISR shadow accumulates the MISR signatures and stores the result as MISR shadow data. After the final test pattern included in the test pattern split executes, the MISR shadow combines the bits in the MISR shadow data to form a single bit MISR shadow status that indicates whether the layout partition, and therefore the functional region, responds properly to the test pattern split. By efficiently summarizing the test responses, the MISR shadow optimizes the resources required to identify defective functional regions.

19 Claims, 5 Drawing Sheets

PERFORMING ON-CHIP PARTIAL GOOD DIE IDENTIFICATION

BACKGROUND OF THE INVENTION

Field of the Invention

Embodiments of the present invention relate generally to integrated circuit fabrication and testing and, more specifically, to performing on-chip partial good die identification.

Description of the Related Art

Oftentimes, in a process known as "partial good die identification," a silicon manufacturer attempts to identify and disable defective regions of a fabricated die. Subsequently, the silicon manufacturer packages and sells any partially-disabled dies as products or parts having reduced functionality or reduced performance in an attempt to minimize the number of dies that are discarded as defective. To facilitate partial good die identification, chip designers typically implement functional clamps that may be activated to disable specific regions of the chips that are identified as defective. More specifically, when testing the die, if a defective region is identified, then the silicon manufacturer activates the associated functional clamp to disable the defective region.

As part of identifying defective functional regions of dies, a chip designer and/or silicon manufacturer implement test logic that applies test patterns to isolated functional regions within the die and then monitors the response of those isolated functional regions to the test patterns. For small dies, relatively simple test logic may enable the silicon manufacturer to adequately test each die and identify any defective regions in an acceptable amount of testing time. For example, in some implementations, a different pin can be allocated for the testing of each different functional region. As used herein, a "pin" refers to an outer connection of a die and/or a package pin that the outer connection is bonded to as part of the manufacturing process. If the response received via a particular pin does not match the expected response, then the test logic identifies the corresponding functional region as defective. However, as a general matter, the form factors of packages do not increase over time as in proportion to increases in die size. Consequently, as the sizes of dies have increased, the ratio between the number of pins and the size of the die has decreased so much that allocating a separate test pins for testing each separate functional region in a die has become unfeasible.

One approach to identifying defective functional regions in a die when the number of test pins is less than the number of functional regions, involves implementing post processing software in automatic test equipment (ATE) to perform a variety of operations on the response data generated by the die and received via the test pins. However, the time required for the post processing software to determine which functional regions are associated with failing response data may be prohibitive. In particular, because many optimization techniques intermix the data between functional regions and across test pins, identifying the failing functional regions may be complex and exceed the available test time and/or ATE resources, such as memory.

As the foregoing illustrates, what is needed in the art are more effective techniques for identifying defective functional regions within a die.

SUMMARY OF THE INVENTION

One embodiment of the present invention sets forth a computer-implemented method for identifying defective functional regions within a die. The method includes computing a first signature based on a first test pattern that is applied to a first layout partition within the die; combining the first signature and first shadow data to generate second shadow data; and reducing a number of bits included in the second shadow data to generate a first status indicator that indicates whether the first layout partition is defective.

Further embodiments provide, among other things, systems that include different elements configured to implement the method set forth above.

One advantage of the disclosed techniques is that they optimize the resources required to perform partial good die identification. More specifically, because each MISR shadow status consolidates responses to multiple test patterns, identifying defective functional regions based on the MISR shadow statuses may be performed efficiently using minimal automated test equipment (ATE) resources. In particular, comprehensive pass/fail data may be obtained for multiple functional regions in an acceptable amount of time via limited numbers of scan out pins in the presence of optimization techniques that intermix data between functional regions

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skilled in the art that the present invention may be practiced without one or more of these specific details.

System Overview

Figure 1:
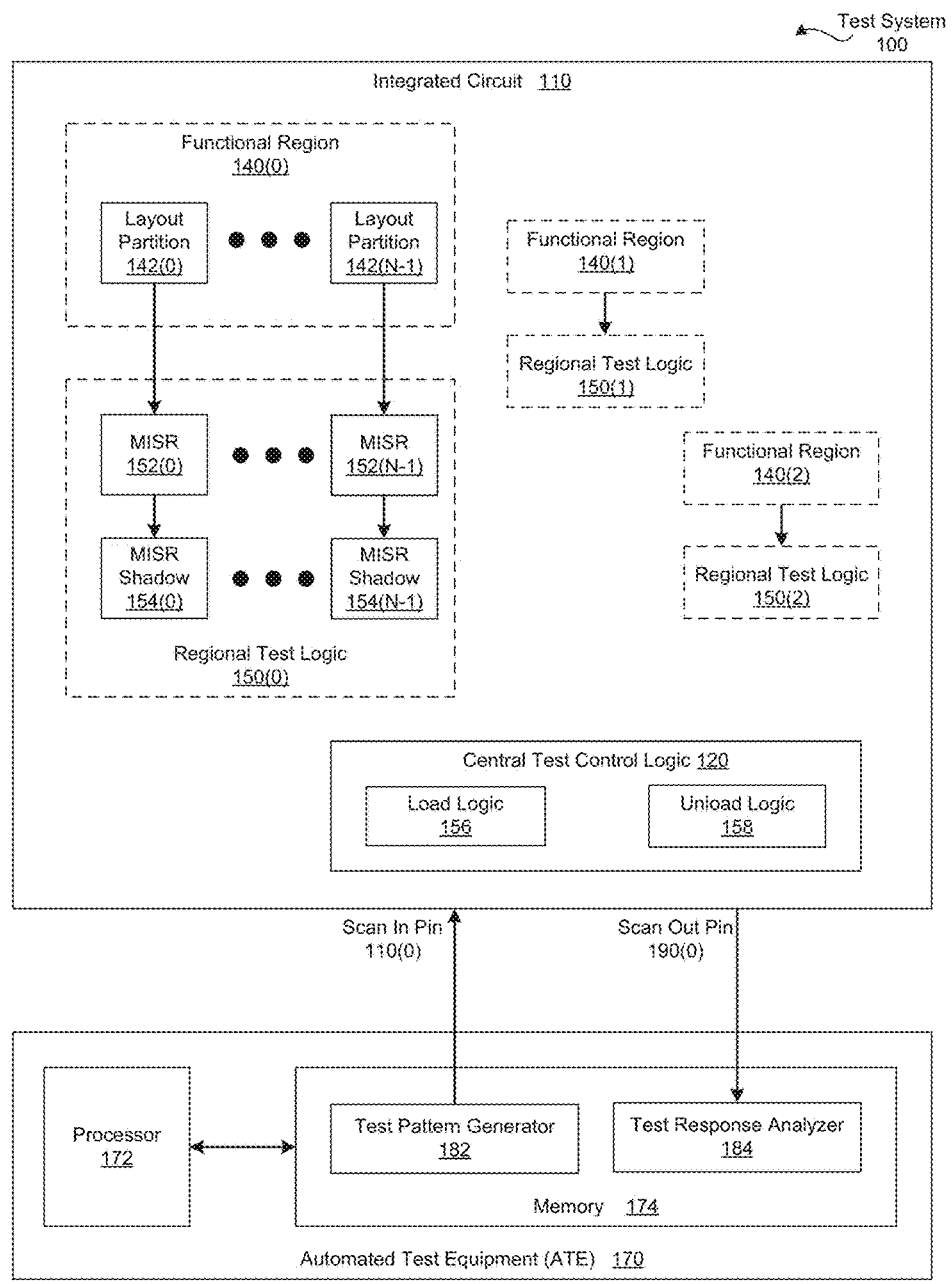
FIG. 1 is a conceptual illustration of a test system configured to implement one or more aspects of the present invention.

FIG. 1 is a conceptual illustration of a test system 100 configured to implement one or more aspects of the present invention. As shown, the test system 100 includes, without limitation, an automated test equipment (ATE) 170 and an integrated circuit 110. In a process known as "integrated circuit manufacturing," a wafer of semiconducting material is fabricated. Each wafer includes multiple copies of the integrated circuit 110, and each copy is referred to as a "die." At the silicon manufacturing facility, the ATE 170 is configured to determine whether each fabricated die functions properly.

The ATE 170 includes, without limitation, a processor 172 and a memory 174. In alternate embodiments, the ATE 170 may include any number of processors 172 and memories 174. The processors 172 and the memories 174 may be interconnected in any technically feasible fashion. The processor 172 performs computations and controls and coordinates operations of other components included in the ATE 170. The memory 174 stores content, such as test patterns, and applications for use by the processor 172.

As shown, the memory 174 includes, without limitation, a test pattern generator 182 and a test response analyzer 184. Notably, the number of pins, time, and resources allocated to testing the dies are limited. Consequently, the test system 100 implements optimization algorithms that reduce the volume of data that the ATE 170 transmits to the integrated circuit 110 and the volume of data that the ATE 170 receives from the integrated circuit 110. Such optimization algorithms may include any number of test compression techniques, scan-based testing techniques, and the like. In particular, using a scan-based testing methodology, the test pattern generator 182 applies test patterns to each of the dies via one or more scan in pins 110. In a complementary fashion, the test response analyzer 184 performs operations on the test response data received from each of the dies via one or more scan out pins 190 to determine whether the die functions correctly.

To minimize the number of dies that are discarded as defective based on such functional testing, the test pattern generator 182 and the response analyzer 184 are configured to identify defective regions within each of the dies. To facilitate such "partial good die identification," the integrated circuit 110 includes a central test control logic 120, any number of functional regions 140, any number of regional test logics 150. The central test control logic 120 includes, without limitation, a load logic 156 and an unload logic 158. The load logic 156 receives test patterns from the test pattern generator 182 via the scan in pin 110 and applies the test patterns to the functional regions 140. As the functional regions 140 execute the test patterns, the unload logic 158 receives test response data from the regional test logics 150 and then transmits the test response data to the test response analyzer 184 via the scan out pin 190.

Typically, each of the functional regions 140 is associated with a different regional test logic 150. Consequently, the number of the functional regions 140 equals the number of the regional test logics 150. As shown for the functional region 140(0), each of the functional regions 140 includes any number of layout partitions 142. For explanatory purposes, although the logic included in each layout partition 142 may be replicated across the integrated circuit 110, each copy of the logic is referred to herein as a separate layout partition 142. As persons skilled in the art will recognize, to reduce routing included in the integrated circuit 110, each functional region 140 typically includes proximally situated layout partitions 142. However, in some embodiments, the layout partitions 142 included in each of the functional regions 140 may be distributed in a non-contiguous fashion across the integrated circuit 110. In alternate embodiments, the functionality and/or the physical layout of the integrated circuit 110 may be organized in any fashion, with any number of levels of hierarchy, and the testing techniques outlined herein may be modified to reflect the alternate organization scheme.

Although not shown, each of the functional regions 140 is associated with functional clamps that may be activated to disable the function region 140. If the silicon manufacturer determines that the test response data of a given functional region 140 indicate that the given function region 140 is defective, then the silicon manufacturer activates the associated functional clamp to disable the functional region 140. Subsequently, the silicon manufacturer packages and sells the partially-disabled die as a reduced functionality or reduced performance part.

For explanatory purposes, multiple instances of like objects are denoted with reference numbers identifying the object and parenthetical numbers identifying the instance where needed. Further, a range of "X" like objects are denoted with a parenthetical range (i.e., (0:X-1)). As shown for the regional test logic 150(0), each of the regional test logics 150 includes, without limitation, multiple input signature registers (MISRs) 152. More precisely, for each of the layout partitions 142 included in a given functional region 140, the regional test logic 150 associated with the function region 140 includes a dedicated MISR 152. As persons skilled in the art will recognize, for each test pattern, the MISR 152 generates a MISR signature based on the responses received from the associated layout partition 142. The MISR signature includes condensed test response data that may be used to evaluate the functionality of the layout partition 152 with respect to the test pattern.

In operation, the unload logic 158 receives the MISR signatures and transmits the MISR signatures to the test response analyzer 184 via the scan out pin 190. However, typically the number of scan out pins 190 available for transmitting test response data is less than the number of the functional regions 140. Further, each MISR signature may include a relatively large number of bits. For example, in some embodiments, each MISR signature may include eighty bits. Consequently, the unload logic 158 implements optimization techniques that compress and intermix the MISR signatures between multiple functional regions 140 and then transmits the compressed and intermixed data to the test response analyzer 184 via the available scan out pins 190.

However, identifying the failing functional regions 140 for partial good die identification based on such intermixed data may be complex and exceed the available test time and/or resources included in the ATE 170, such as the memory 174. For this reason, the test system 100 implements a hierarchical abridgement strategy in conjunction with a tagging process. In general, for each MISR 152, the regional test logic 150 includes a multiple input signature register shadow (MISR shadow) 154 that combines multiple MISR signatures received from the MISR 152 to generate a MISR shadow status. The MISR shadows statuses enables relatively simple identification of failing functional regions. In alternate embodiments, each MISR shadow status may be any type of status indicator that is implemented in any technically feasible fashion.

On-Chip Testing and Identification of Defective Functional Regions

In operation, the test pattern generator 182 subdivides the test patterns into a hierarchy of test patterns. In particular, the test pattern generator 182 divides the test patterns into test pattern splits. For example, the test pattern generator 182 may divide fifty thousand test patterns into ten test pattern splits that each include five thousand test patterns. Further, the test pattern generator 182 tags the scan out pin 190 on a per-cycle basis to indicate the functional region 140 that is associated with the data received via the scan out pin 190. The test pattern generator 182 may tag the scan out pin 190 in any technically feasible fashion.

For each test pattern, each of the MISRs 152 generate a MISR signature. By contrast, each of the MISR shadows 154 accumulates the MISR signatures generated by the associated MISR 152 in response to all the test patterns included in a test pattern split. After all the test patterns included in the test pattern split have finished executing, each of the MISR shadows 154 generates a single bit MISR shadow status based on the accumulated MISR signatures. Each of the MISR shadow statuses indicates whether the layout partition 142 associated with the MISR shadow 142 (indirectly via the associated MISR 152) is fully functional with respect to the test pattern split.

Subsequently, the unload logic 158 daisy-chains the MISR shadow statuses into a MISR shadow status chain using scan-based techniques. As the test response analyzer 184 receives the MISR shadow statuses via the scan out pin 190, the test response analyzer 184 identifies any defection function regions 140 based on the value of the MISR shadow status and the per-cycle tagging. For example, in some embodiments, if the MISR shadow status equals one during a given clock cycle, then the test response analyzer 184 identifies the tagged functional region 140 as defective.

Note that the techniques described herein are illustrative rather than restrictive, and may be altered without departing from the broader spirit and scope of the invention. In particular, the techniques outlined herein are applicable to any ATE 170 and any integrated circuit 110. Further, any subset of the functionality described herein may be implemented in the ATE 170, the integrated circuit 110, or any combination thereof. For example, the central test control logic 120 may be configured to partition the test patterns into test pattern splits instead of or in combination with the test pattern generator 182.

The "on-chip" portion of the test functionality that is included in the integrated circuit 110 may be implemented in any technically feasible fashion. For example, the regional test logics 150 and the central test control logic 120 may include combinatorial elements, data storage elements, and the like. The elements included in the regional test logics 150 and the central test control logic 120 may be implemented in any technology and in hardware, software, or a combination of hardware and software. In alternate embodiments, any number of the MISRs 152 may be replaced with any number and type of signature registers, and any number of the MISR shadows 154 may be replaced with any number and type of signature accumulation logic.

Figure 2:
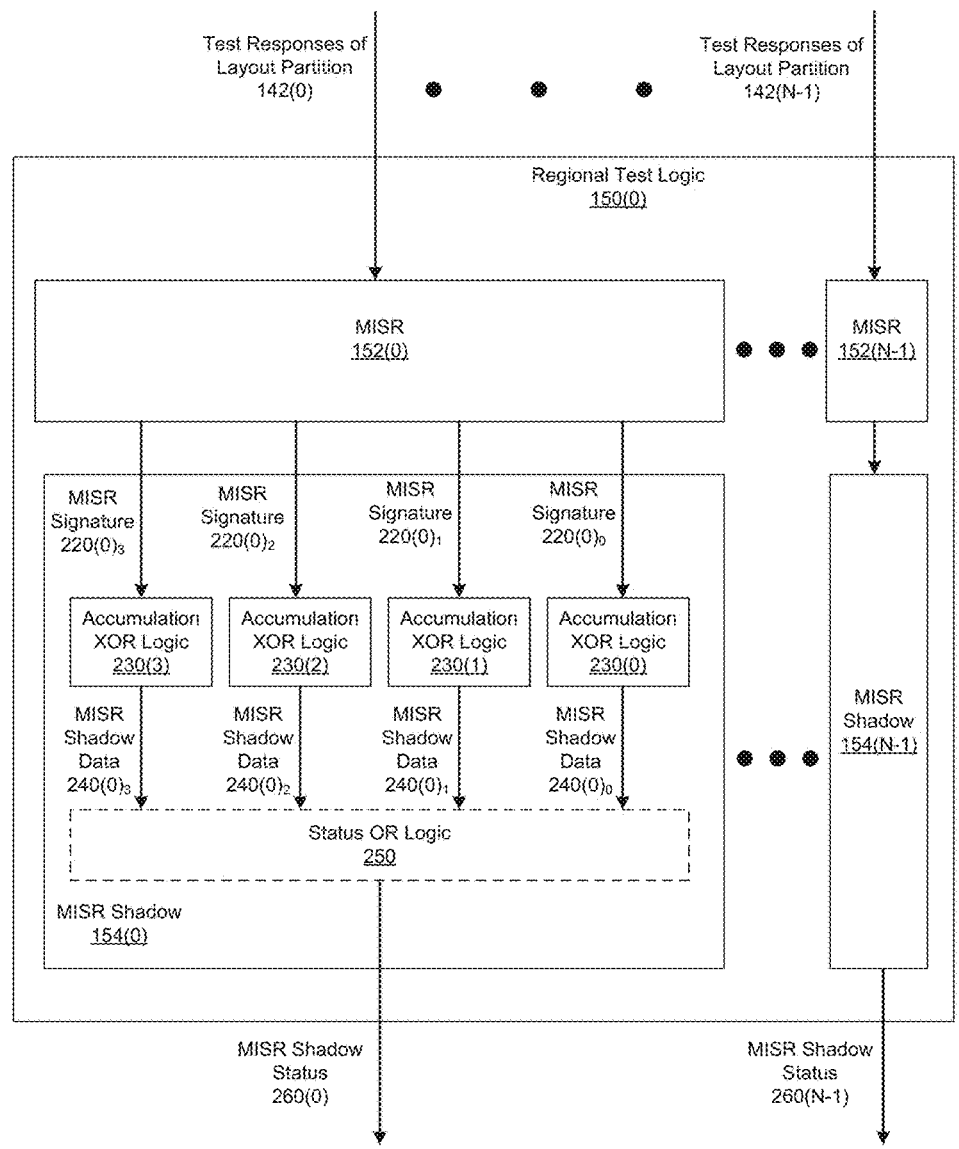
FIG. 2 is a more detailed illustration of the regional test logic of FIG. 1, according to various embodiments of the present invention.

FIG. 2 is a more detailed illustration of the regional test logic 150(0) of FIG. 1, according to various embodiments of the present invention. As shown, the regional test logic 150(0) includes, without limitation, the MISRs 152(0:N−1) and the MISR shadows 154(0:N−1), where N is any integer greater than or equal to one. For explanatory purposes only, the MISR shadow 154(0) is depicted in detail. Although not shown, the implementation of the other MISR shadows 154 is similar to the implementation of the MISR shadow 154(0). However, each of the MISR shadows 154 is associated with a different MISR 152 and, consequently, a different layout partition 142.

In operation, the layout partition 142(0) included in the functional region 140(0) generates test responses to test patterns included in test pattern splits. Based on the test responses of the layout partition 142(0), the MISR 152(0) computes a MISR signature 220(0) that is associated with the layout partition 142(0). For explanatory purposes only, the MISR signature 220(0) associated with the layout partition 142(0) is depicted as four bits. In alternate embodiments, each of the MISR signatures 220 may include any number of bits that is consistent with the functionality of the MISR 152.

As shown, the MISR shadow 154(0) includes, without limitation, accumulation exclusive OR (XOR) logic 230(0:3) and status OR logic 250. In alternate embodiments, each of the MISR shadows 154 may include any number of accumulation XOR logics 230 that is consistent with the functionality of the associated MISR 152. More specifically, the number of accumulation XOR logics 230 included in a given MISR shadow 154 typically matches the number of bits included in the MISR signature 220 generated by the associated MISR 152. For explanatory purposes, multiple bits of a single object are denoted with a reference number identifying the object and a subscript identifying the bit where needed. For example, the $3^{rd}$ bit of the MISR signature 220(0) is denoted with $220(0)_3$.

After the layout partition 142(0) finishes executing a test pattern, the accumulation XOR logic 230($i$) receives the MISR signature $220(0)_i$ from the MISR 152(0). The accumulation XOR logic 230($i$) then performs an XOR operation between the MISR signature $220(0)_i$ and a MISR shadow data that is stored in storage elements, not shown in FIG. 2, included in the accumulation XOR logic 230($i$). Such storage elements may include any number and type of elements capable of storing bits of data including, without limitation, flip-flops, latches, and the like. Accordingly, at any given time, the accumulation XOR logic 230($i$) stores the MISR shadow data $240(0)_i$ that represents contributions from all the test patterns included in the test pattern split that have finished executing.

In alternate embodiments, the storage elements may be implemented in any technically feasible fashion at any granularity and may be included in any component within the die that is accessible by the MISR shadow 154. For example, and without limitation, the storage elements may be implemented as part of any number and combination of dynamic random-access memories (DRAMs), static random-access memory (SRAMs), content addressable memories (CAMs), caches, and the like.

In general, before executing the first test pattern included in a test pattern split, the central test control logic 120 initializes the MISR shadow data to a known value. Consequently, because the MISR shadow 154 processes the MISR signatures 220(0) in a deterministic manner, at any given time the value of the MISR shadow data 240(0) indicates whether the layout partition 140(0) is defective with respect to the test patterns that have finished executing.

More specifically, to reduce the time and resources required to correctly interpret the MISR shadow data 240(0), the test pattern generator 182 computes a complementary signature based on the expected test responses of the layout partition 142(0) to the test patterns included in a given test pattern split. Before executing the first test pattern included in the test pattern split, the central test control logic 120 stores this complementary signature in the MISR shadow 154(0) as the initial MISR shadow data. The test pattern generator 182 may compute the complementary signature in any technically feasible fashion. Further, the MISR shadow 154(0) may store the complementary signature in any storage elements included in the accumulation XOR logic 230(i). Such storage elements may include flip-flops, latches, and the like.

As a result of initializing the MISR shadow data to the complementary signature, interpreting the MISR shadow data 240(0) after the final test pattern included in the test pattern split executes is relatively simple. If all the bits included in the MISR shadow data 240(0) are zero, then the layout partition 142(i) is fully functional with respect to the test pattern split. If, however, any of the bits included in the MISR shadow data 240(0) is one, then the layout partition 142(i) is not fully functional. Accordingly, after the final test pattern included in a test pattern split executes, the status OR logic 250 included in the MISR shadow 154(0) performs OR operations between the bits included in the MISR shadow data 240(0) to generate a MISR shadow status 220(0). If the MISR shadow status 220(0) is zero, then the layout partition 142(0) is fully functional with respect to the test pattern split. If, however, the MISR shadow status 220(0) is one, then the layout partition 142(0) is defective.

In alternate embodiments, each of the MISR shadows 154 may implement any logic, organized in any technically feasible fashion, that condenses the data included in the MISR signatures 220. For example, in some embodiments, the MISR shadow 154(0) may include the accumulation XOR logic 230 but may not include the status OR logic 250. In such embodiments, the central test control logic 120 may initialize the MISR shadow data to zero. After the final test pattern finishes executing, the test response analyzer 184 may perform comparison operations between all the bits included in the MISR shadow data and a predetermined "good" signature to determine whether the layout partition 142(0) is fully functional with respect to the test pattern split.

Referring to FIG. 1, after the test pattern split finishes executing, the unload logic 158 included in the central test control logic 120 concatenates the MISR shadow statuses 220 into a MISR shadow status chain. The unload logic 158 then sequentially scans out the MISR shadow status chain via the scan out pin 190(0). The unload logic 158 may be configured to daisy-chain any number of the MISR shadow statuses 220 associated with any number of the layout partitions 142 and included in any number functional regions 140. Consequently, a single scan out pin 190(0) may convey functional data regarding multiple functional regions 140. As previously described, to enable the test response analyzer 184 to correctly identify the defective functional region 140 associated with a non-zero MISR shadow status 220, the test pattern generator 182 may tag the scan out pin 190(0) based on a clock cycle during an initialization process.

Figure 3A:
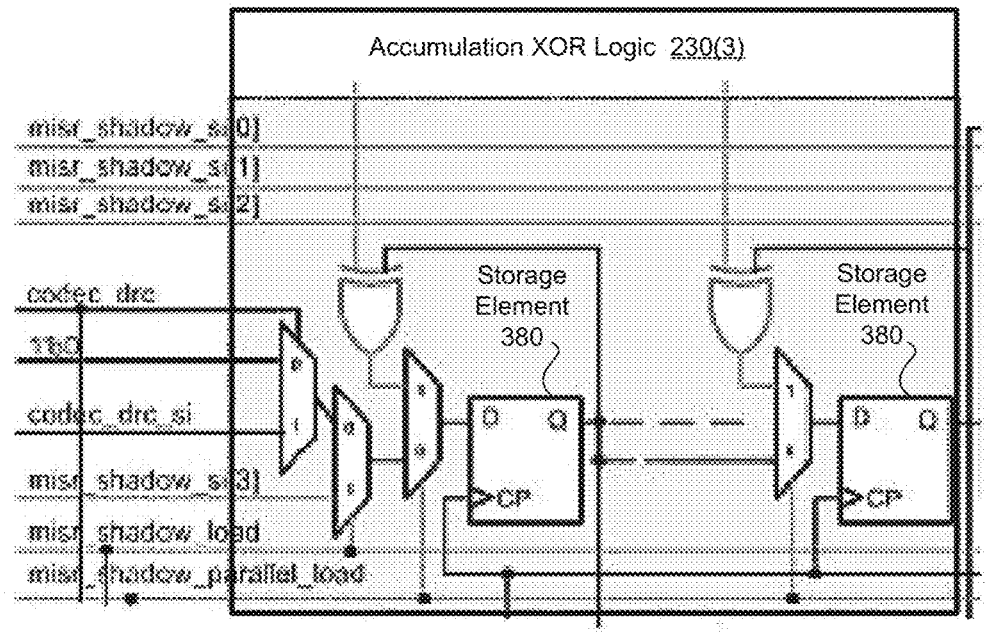
FIG. 3A is a more detailed illustration of the accumulation exclusive OR (XOR) logic of FIG. 2, according to various embodiments of the present invention.

FIG. 3A is a more detailed illustration of the accumulation exclusive OR (XOR) logic 230(3) of FIG. 2, according to various embodiments of the present invention. In general, each bit included in the MISR signature 220 is processed by a corresponding accumulation XOR logic 230 included in the MISR shadow 154. For example, if there are forty bits included in the MISR signature 220, then there are forty corresponding accumulation XOR logics 230. In alternate embodiments, the MISR shadow 154 may implement any type of logic organized in any technically feasible fashion.

As shown, inputs to the accumulation XOR logic 230(3) include, without limitation, a "misr_shadow_si(3)" signal, a "misr_shadow_load signal," and a "misr_shadow_parallel_load" signal. The misr_shadow_si(3) is the $3^{rd}$ bit included in the complement signature corresponding to a selected test pattern split and associated with the MISR 152(0). As part of an initialization process for the selected test pattern split, the central control logic 120 asserts the misr_shadow_load and configures the accumulation XOR logic 230(3) to store the value of the misr_shadow_si(3) in storage element 380. Subsequently, the central control logic 120 de-asserts the misr_shadow_load and sequentially applies each of the test patterns included in the test pattern split to the layout partition 142(0).

As each of the test patterns finishes executing, the central control logic 120 asserts the misr_shadow_parallel_load. In response, the accumulation XOR logic 230(3) performs exclusive OR operations between the MISR signature 220(0)$_3$ and the MISR shadow data. In this manner, the accumulation XOR logic 230(3) accumulates the value of the MISR signature 220(0)$_3$ across the test patterns included in the test pattern split.

Figure 3B:
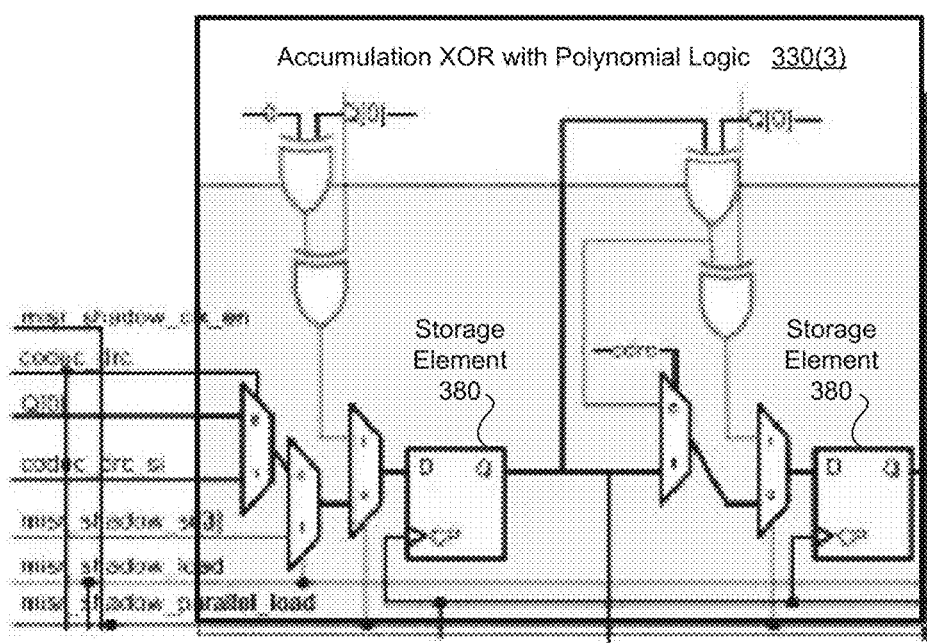
FIG. 3B is an illustration of an accumulation exclusive OR (XOR) with polynomial logic that may be included in the multiple input signature register (MISR) shadow of FIG. 1, according to various other embodiments of the present invention.

FIG. 3B is an illustration of an accumulation exclusive OR (XOR) with polynomial logic 330(3) that may be included in the multiple input signature register (MISR) shadow 154(0) of FIG. 1, according to various other embodiments of the present invention. More specifically, in some embodiments, each of the MISR shadows 154 may include the accumulation XOR with polynomial logics 330 instead of the accumulation XOR logics 230. In general, each bit included in the MISR signature 220 is processed by a corresponding accumulation XOR logic 230 with polynomial logic 330 included in the MISR shadow 154. For example, if there are forty bits included in the MISR signature 220, then there are forty corresponding accumulation XOR with polynomial logics 330. In alternate embodiments, the MISR shadow 154 may implement any type of logic organized in any technically feasible fashion.

As shown, inputs to the accumulation XOR with polynomial logic 330(3) include, without limitation, a "misr_shadow_si(3)" signal, a "misr_shadow_load signal," and a "misr_ shadow_parallel_load" signal. The misr_shadow_si (3) is the $3^{rd}$ bit included in the complement signature corresponding to a selected test pattern split and associated with the MISR 152(0). As part of an initialization process for the selected test pattern split, the central control logic 120 asserts the misr_shadow_load and configures the accumulation XOR logic 330(3) to store the value of the misr_shadow_si(3) in the storage element 380. Subsequently, the central control logic 120 de-asserts the misr_shadow_load and sequentially applies each of the test patterns included in the test pattern split to the layout partition 142(0).

While the layout partition 142(0) executes each of the test patterns, the accumulation XOR with polynomial logic 330(3) computes the $3^{rd}$ bit of a MISR shadow polynomial and performs XOR operations between this MISR shadow polynomial bit and the MISR shadow data. As each of the test patterns finishes executing, the central control logic 120 asserts the misr_shadow_parallel_load. In response, the accumulation XOR with polynomial logic 330(3) receives a snapshot of the MISR signature 220(0)$_3$ from the MISR 152(0) and performs an XOR operation between the snapshot and the MISR shadow data.

As the accumulation XOR logic 230(3) depicted in FIG. 3A and the accumulation XOR with polynomial logic 330(3) depicted in FIG. 3B illustrate, the logic included in the MISR shadows 154 may implement any functionality that extracts concise test response data based on multiple, sequentially received MISR signatures 220. In particular, the MISR shadows 154 are configured to combine the test responses across multiple test patterns to reduce the amount of test response data required to determine whether each of the functional regions 140 is defective. The MISR shadows 154 may be implemented in software, hardware, or any combination thereof. Further, any hardware implementation may include any number of combinatorial elements, any number of data storage elements, and be implemented in any technology.

Note that the logic circuits described herein are illustrative rather than restrictive, and may be altered without departing from the broader spirit and scope of the invention. In general, the MISR shadow 154 may implement any logic, organized in any technically feasible fashion, that condenses the data included in the MISR signatures 220. More specifically, any such logic is a structural equivalent that falls within the scope of the invention.

Figure 4:
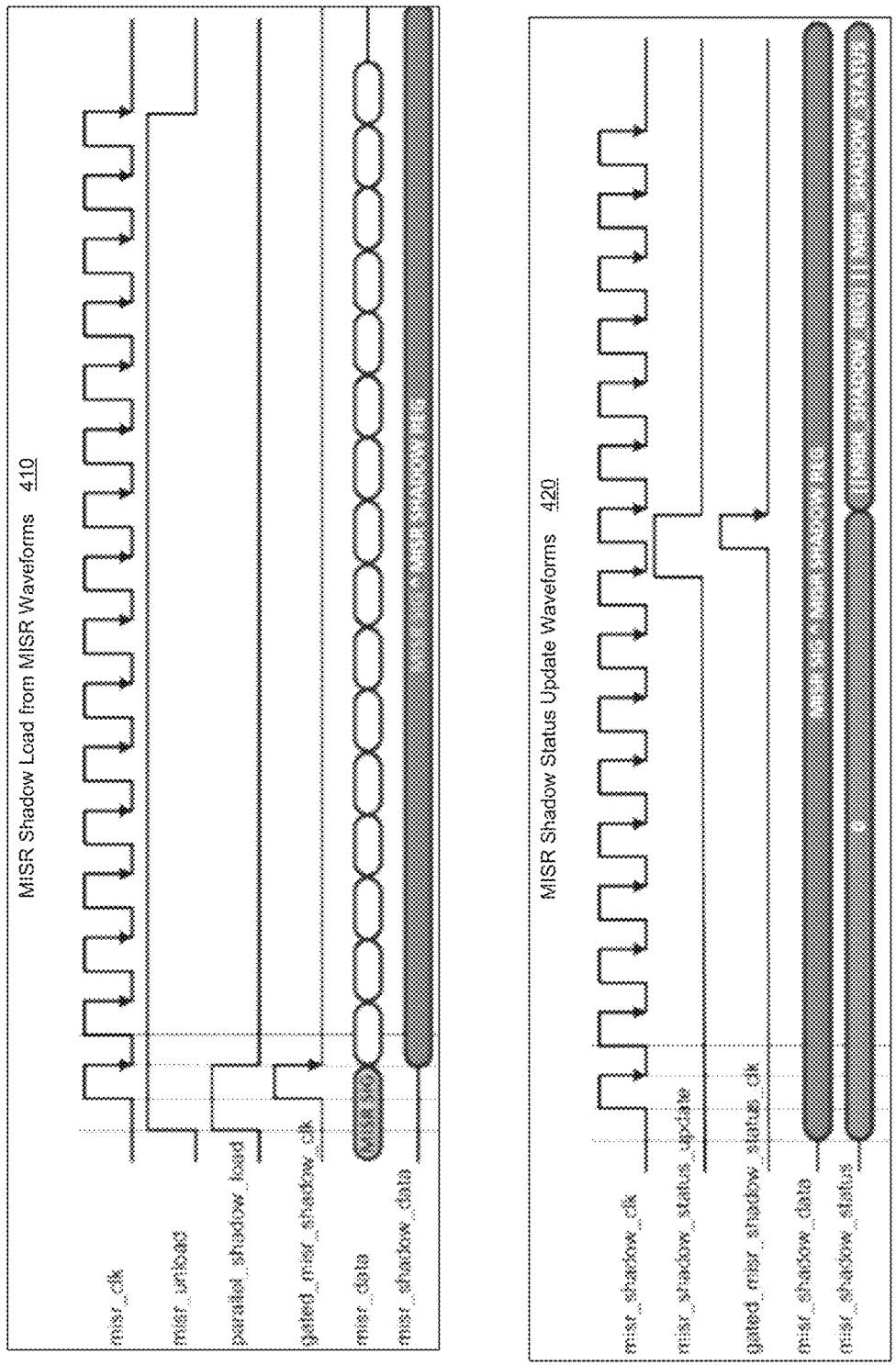
FIG. 4 is a conceptual illustration of waveforms that depict the operation of the multiple input signature register (MISR) shadow of FIG. 2, according to various embodiments of the present invention.

FIG. 4 is a conceptual illustration of waveforms that depict the operation of the multiple input signature register (MISR) shadow 154(0) of FIG. 2, according to various embodiments of the present invention. For explanatory purposes only, MISR shadow load from MISR waveforms 410 graphically depict how the MISR shadow 154(0) stores the MISR shadow data 240(0) based on the MISR signatures 220(0) associated with multiple test patterns. In a complementary fashion, MISR shadow status update waveforms 420 graphically depict how the MISR shadow 154(0) generates the MISR shadow status 260(0) based on the MISR shadow data 240(0) stored in the MISR shadow 154(0). In alternate embodiments, any number of MISR shadows 154 may generate any number of MISR shadow statuses 260 in any technically feasible fashion that consolidates the MISR signatures 220 across multiple test patterns.

During each cycle of a "misr_clk" signal, the MISR 152(0) generates a new MISR signature 220(0) based on the responses of the layout partition 142(0) to a particular test pattern included in a test pattern split. Upon receiving the MISR signature 220(0), the accumulation XOR logic 230 included in the MISR shadow 154(0) performs bitwise XOR operations between the MISR signature 220(0) and the MISR shadow data currently stored in the MISR shadow 154(0). Accordingly, at any point in time, the MISR shadow data 240(0) stored in the MISR shadow 154 reflects the responses of the layout partition 142(0) to all the test patterns included in the test pattern split that have finished executing.

The MISR shadow 154(0) updates the MISR shadow status 260(0) based on a "misr_shadow_clk" signal. Notably, the cycle time of the misr_shadow_clk is longer than the cycle time of the misr_clk. More precisely, during a single misr_shadow_clk cycle, all the test patterns included in a given test pattern split execute. At the end of each misr_shadow_clk cycle, the status OR logic 250 included in the MISR shadow 154(0) performs OR operations between the bits included in the MISR shadow data 240(0) to generate the single bit MISR shadow status 260(0). For example, if the MISR signature 220(0) includes forty bits, then the MISR shadow 154(0) includes forty accumulation XOR logics 230. Each of the accumulation XOR logics 230 stores one bit of the MISR shadow data 240(0). At the end of each misr_shadow_clk cycle, the status OR logic 250 performs OR operations between the forty bits included in the MISR shadow data 240(0) to generate the MISR shadow status 260(0).

Figure 5:
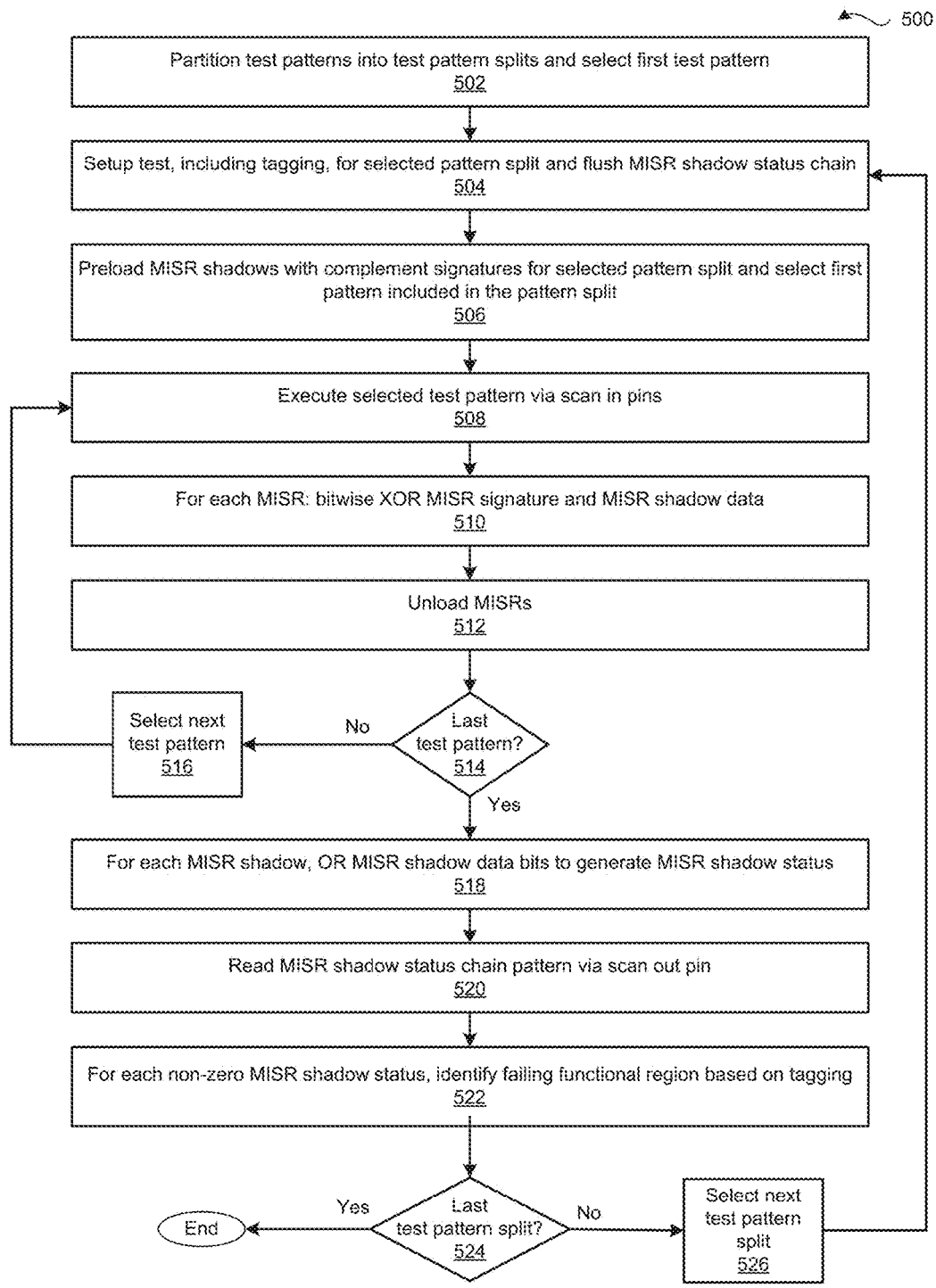
FIG. 5 is a flow diagram of method steps for identifying defective functional regions within a die, according to various embodiments of the present invention.

FIG. 5 is a flow diagram of method steps for identifying defective functional regions within a die, according to various embodiments of the present invention. Although the method steps are described with reference to the systems of FIGS. 1-4, persons skilled in the art will understand that any system configured to implement the method steps, in any order, falls within the scope of the present invention.

As shown, a method 500 begins at step 502, where the test pattern generator 182 included in the automated test equipment (ATE) 170 selects a first pattern split. The test pattern generator 182 may generate and/or select the first pattern split in any technically feasible fashion. At step 504, the test pattern generator 182 initializes the on-chip test logic including the central test control logic 120 and the regional test logics 150. Among other things, the test pattern generator 182 tags each of the MISR shadow statuses 260 with the associated functional region. The test pattern generator 182 may tag the MISR shadow statuses 260 in any technically feasible fashion. For example, in some embodiments, the test pattern generator 182 may tag the associated scan out pin 190 based on a clock cycle. As part of this pattern split initialization process, the central test control logic 120 flushes the MISR shadow status chain to ensure that the initial values stored in the chain indicate no identified defects.

At step 506, the test pattern generator 182 and the central test control logic 120 preload each of the MISR shadows 154 with an independent complement signature computed based on the selected test pattern split. In particular, for each of the MISR shadows 154, the test pattern generator 182 computes a complement signature and the central test control logic 120 configures the MISR shadow 154 to store the complement signature as the MISR shadow data. The test pattern generator 182 computes the complement signatures based on an accumulation of expected MISR signatures corresponding to the test patterns included in the selected test pattern split and the exclusive OR logic implemented in the MISR shadow 154. The test pattern generator 182 then selects the first test pattern included in the selected test pattern split.

If a particular layout partition 142 functions as expected, then preloading the complement signature ensures that the MISR shadow status 260 associated with the layout partition 142 is zero after the sequential application of the test patterns include in the selected test pattern split. By contrast, if the layout partition 142 is defective, then preloading the complement signature ensures that the MISR shadow status 260 associated with the layout partition 142 is one after the sequential application of the test patterns included in the selected test pattern split. In alternate embodiments, the test pattern generator 182 may compute the complement signature in any technically feasible fashion that is consistent with the expected responses to the selected test pattern split and the logic implemented in the MISR 152 and the MISR shadow 154.

At step 508, the test pattern generator 182 transmits the selected test pattern to the layout partitions 142 via the scan in pin 110 and the central test control logic 120. More precisely, the load logic 156 included in the central test control logic 120 routes the subset of the selected test pattern that is associated with the layout partition 142(i) to the layout partition 142(i). The test pattern generator 182 and the central test control logic 120 may coordinate to perform any number of optimization operations to reduce the size of the selected test pattern. For example, in various embodiments, the test pattern generator 182 and the central test control logic 120 may implement any number and combination of compression techniques, scan-based methodologies, and the like. As the layout partition 142(i) executes based on the selected test pattern, the MISR 152(i) receives the test responses from the layout partition 142(i) and consolidates the test responses into the MISR signature 220(i).

At step 510, each of the MISR shadows 154 receives the MISR signature 220 generated by the corresponding MISR 152 and performs accumulation operations to consolidate the MISR signature 220 and the current MISR shadow data. The MISR shadows 154 may implement any logic that is consistent with the preloaded complement signature. For example, in some embodiments, the MISR shadow 154 may perform bitwise XOR operations between the MISR shadow data currently stored in the MISR shadow 154 and the MISR signature 220. In this fashion, at any given time, the MISR shadow data 240 represents a combination of the complement signature and the test responses of the associated layout partition 142 to all test patterns in the selected test pattern split that have finished executing. At step 512, the MISRs 152 optionally unload the MISR signatures 220, and the MISR signatures 220 may be used for detailed failure analysis.

At step 514, the test pattern generator 182 determines whether the selected test pattern is the last test pattern included in the selected test pattern split. If, at step 514, the test pattern generator 182 determines that the selected test pattern is not the last test pattern included in the selected test pattern split, then the method 500 proceeds to step 516. At step 516, the test pattern generator 182 selects the next test pattern included in the selected test pattern split and the method 500 returns to step 508, where the test pattern generator 182 delivers the selected test pattern to the layout partitions 142 via the scan in pin 110 and the load logic 156.

If, however, at step 514, the test pattern generator 182 determines that the selected test pattern is the last test pattern included in the selected test pattern split, then the method 500 proceeds directly to step 518. At step 518, the each of the MISR shadows 154 compresses the MISR shadow data 250 to generate the MISR shadow status 260. The MISR shadows 154 may implement any type of logic and any type of compression operations that reduce the number of bits that represent the MISR shadow data 250. For example, in some embodiments, the MISR shadow data 250 may include sixty bits and the MISR shadow status 154 may include one bit. In such embodiments, the status OR logic 250 may perform OR operations between the sixty bits included in the MISR shadow data 240 to generate the MISR shadow status 260.

At step 520, the unload logic 158 concatenates the MISR shadow statuses 154 associated with multiple layout partitions 142 and then scans out this MISR shadow status chain pattern via the scan out pin 190. Notably, the scan out pin 190 may be configured to output any number of the MISR shadow statuses 154 and the MISR shadow statuses 154 may be associated with any number of layout partitions 142 and any number of functional regions 140.

At step 522, the test response analyzer 184 processes the MISR shadow statuses 154 received via the scan out pin 190 to identify any of the functional regions 140 that are defective. Because the scan out pin 190 includes tagging that identifies the functional region 140 per clock cycle, the test response analyzer 184 may efficiently map the MISR shadow statuses 154 to the associated functional regions 140. If any of the MISR shadow statuses 154 are one, then the test response analyzer 184 identifies the associated functional region 140 as defective.

At step 524, the test pattern generator 182 determines whether the selected test pattern split is the last test pattern split. If, at step 524, the test pattern generator 182 determines that the selected test pattern split is not the last test pattern split, then the method 500 proceeds to step 526. At step 526, the test pattern generator 182 selects the next test pattern split and the method 500 returns to step 506 where the test pattern generator 182 flushes the MISR shadow status chain and prepares to execute the selected test pattern split. If, however, at step 524, the test pattern generator 182 determines that the selected test pattern split is the last test pattern split, then the functional testing of the die is complete and the method 500 terminates.

In sum, the disclosed techniques may be used to efficiently identify defective functional regions within a die. For each functional region within the die, corresponding on-chip regional test logic receives and applies test patterns to each of the layout partitions included in the functional region and then processes the responses to the test patterns. Notably, for each layout partition, the regional test logic includes, without limitation, a multiple input signature register (MISR) and a corresponding shadow MISR. In operation, for each test pattern, a MISR generates a MISR signature based on the responses received from the associated layout partition. By contrast, each MISR shadow accumulates the MISR signatures from the associated MISR across multiple test patterns included in a test pattern split.

More specifically, prior to receiving the MISR signatures associated with a test pattern split, the ATE calculates a complement signature that is designed to simplify defect detection for the test pattern split. The central test control logic then stores the complement signature in the MISR shadow. Upon receiving a MISR signature associated with a test pattern, the MISR shadow performs exclusive OR (XOR) operations between the MISR signature and the current data stored in the MISR shadow. Further, after receiving the MISR signature associated with the last test pattern in a test pattern split, the MISR shadow performs OR operations between the bits of the current data stored in the MISR shadow to generate a MISR shadow status. Unload logic then daisy-chains and unloads the MISR shadow statuses output from multiple MISR shadows via a scan out pin for analysis via automated test equipment (ATE). If the MISR shadow status associated with a particular functional region is one, then the ATE identifies the functional region as defective.

Advantageously, because each MISR shadow status consolidates responses to multiple test patterns, comprehensive pass/fail data may be obtained for multiple functional regions in an acceptable amount of time via limited numbers of scan out pins. Further, identifying defective functional regions based on the MISR shadow statuses may be performed efficiently using minimal automated test equipment (ATE) resources, such as processing and memory resources. By contrast, conventional post processing techniques that process MISR signature data may require unacceptable amounts of ATE resources to identify failing functional regions, particularly in the presence of optimization techniques that intermix data between functional regions.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors or gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for identifying defective functional regions within a die, the method comprising:
   computing a first signature based on a first test pattern that is applied to a first layout partition within the die;
   combining the first signature and first shadow data to generate second shadow data;
   reducing a number of bits included in the second shadow data to generate a first status indicator;
   tagging a scan-out pin with a first tag to associate a functional region within the die with a first clock cycle, wherein the first status indicator is scanned out via the scan-out pin during the first clock cycle; and
   determining whether the functional region is defective based on the first status indicator and the first tag.

2. The computer-implemented method of claim 1, further comprising storing a complement signature in one or more storage elements, wherein the complement signature reflects an expected response of the first layout partition to the first test pattern.

3. The computer-implemented method of claim 1, wherein combining the first signature and the first shadow data comprises performing one or more bitwise exclusive OR operations between the first signature and the first shadow data.

4. The computer-implemented method of claim 1, wherein reducing the number of bits included in the second shadow data comprises performing one or more OR operations between bits included in the second shadow data.

5. The computer-implemented method of claim 1, further comprising:
   generating a second status indicator based on applying a second test pattern to a second layout partition within the die; and
   sequentially scanning out the first status indicator and the second status indicator via a first pin.

6. The computer-implemented method of claim 1, further comprising, prior to when the first test pattern is applied to the first layout partition:
   applying a second test pattern to the first layout partition to compute a second signature;
   combining the second signature with a third shadow data to generate the first shadow data; and
   storing the first shadow data in one or more storage elements.

7. The computer-implemented method of claim 1, wherein determining that the functional region is defective comprises comparing the first status indicator to a Boolean value of one.

8. A system, comprising:
   an accumulation logic circuit that is configured to combine a first signature and a first shadow data to generate second shadow data, wherein the first signature is associated with a first test pattern that is applied to a first layout partition within a die during a first cycle of a first clock;
   a status logic circuit that is configured to reduce a number of bits included in the second shadow data to generate a first status indicator during a second cycle of a second clock, wherein a period of the second clock is longer than a period of the first clock;
   a test pattern generator that is configured to tag a scan-out pin with a first tag to associate a functional region within the die with the first clock cycle, wherein the first status indicator is scanned out via the scan-out pin during the first clock cycle; and a test response analyzer that is configured to determine whether the functional region is defective based on the first status indicator and the first tag.

9. The system of claim 8, wherein the first layout partition is included in a first functional region within the die.

10. The system of claim 8, wherein the accumulation logic circuit is further configured to store a complement signature in one or more storage elements, wherein the complement signature reflects an expected response of the first layout partition to the first test pattern.

11. The system of claim 8, wherein the accumulation logic circuit is configured to combine the first signature and the first shadow data by performing one or more bitwise exclusive OR operations between the first signature and the first shadow data.

12. The system of claim 8, wherein that status logic circuit is configured to reduce the number of bits included in the second shadow data by performing one or more OR operations between bits included in the second shadow data.

13. The system of claim 8, wherein a previous cycle of the first clock occurs prior to the first cycle, and the accumulation logic circuit is further configured to:
combine a second signature with a third shadow data to generate the first shadow data, wherein the second signature is associated with a second test pattern that is applied to the first layout partition during the previous cycle; and
store the first shadow data in one or more storage elements.

14. The system of claim 8, wherein a number of bits included in the first status indicator equals one.

15. A system configured to identify defective functional regions within a die, the system comprising:

a signature register that is configured to compute a first signature based on a first test pattern that is applied to a first layout partition within the die;

a signature accumulation logic circuit that is configured to:
for each signature bit included in the first signature, generate a bit included in shadow data based on the signature bit, and
reduce included in the shadow data to generate a first status indicator;

a test pattern generator that is configured to tag a scan-out pin with a first tag to associate a functional region within the die with a first clock cycle, wherein the first status indicator is scanned out via the scan-out pin during the first clock cycle; and a test response analyzer that is configured to determine whether the functional region is defective based on the first status indicator and the first tag.

16. The system of claim 15, wherein the signature accumulation logic circuit is configured to generate a first bit included in the shadow data by performing an exclusive OR operation between a first signature bit included in the first signature and the first bit.

17. The system of claim 15, wherein the signature accumulation logic circuit is configured to reduce the bits included in the shadow data by performing one or more OR operations between the bits included in the shadow data.

18. The system of claim 15, wherein a number of bits included in the first status indicator equals one.

19. The system of claim 15, wherein the first layout partition is included in a first functional region within the die.

* * * * *

UNITED STATES PATENT AND TRADEMARK OFFICE
CERTIFICATE OF CORRECTION

PATENT NO. : 9,829,536 B2
APPLICATION NO. : 15/015100
DATED : November 28, 2017
INVENTOR(S) : Milind Sonawane, Jonathon E. Colburn and Amit Sanghani Page 1 of 1

It is certified that error appears in the above-identified patent and that said Letters Patent is hereby corrected as shown below:

In the Claims

Column 16, Claim 15, Line 9, please insert --bits-- after reduce.

Signed and Sealed this
Thirty-first Day of July, 2018

Andrei Iancu
*Director of the United States Patent and Trademark Office*